United States Patent [19]
Amdursky et al.

[11] Patent Number: 5,557,710
[45] Date of Patent: Sep. 17, 1996

[54] COMPUTER AIDED DESIGN SYSTEM

[75] Inventors: Vardy Amdursky; Ilan Efrat; Shlomo Shlafman, all of Haifa, Israel

[73] Assignee: International Business Machines Corporation, Armonk, N.Y.

[21] Appl. No.: 190,423

[22] Filed: Feb. 2, 1994

[30] Foreign Application Priority Data

Feb. 8, 1993 [GB] United Kingdom ............... 9302450

[51] Int. Cl.⁶ ............................................. G06F 17/50
[52] U.S. Cl. ........................................ 395/119; 395/120
[58] Field of Search ..................................... 395/119, 120; 364/754, 505, 508, 572

[56] References Cited

U.S. PATENT DOCUMENTS 5,136,538  8/1992  Karmarkar ............................. 364/754

OTHER PUBLICATIONS

Encyclopedia of Computer Science & Engineering, 2nd Ed, Ralston & Reilly (1983), Van Nostrand Reinhold Co., pp. 631–632, 927–932.
McCallum P., "Getting Better Results from Linear FEA", Machine Design, v64, n2, pp. 123–126, Feb. 20, 1992.

*Primary Examiner*—Mark K. Zimmerman
*Assistant Examiner*—Cliff N. Vo
*Attorney, Agent, or Firm*—Floyd A. Gonzalez; Jeffrey R. Klembczyk; Blanche E. Schiller

[57] ABSTRACT

In a computer aided design system, a stored geometrical representation of a structure, the material properties thereof, and the loads imposed thereon are converted into a visualization of a mechanical quantity of the structure. A mesh is generated that describes the structure. By application of the finite element method to the mesh, the elements of a stiffness matrix, a loading vector and a vector including an associated degree of freedom index for each row and column of the stiffness matrix is generated. From the stiffness matrix and the loading vector, a matrix A and a right-hand side vector f are generated. A and f are related through the equation Ax=f, wherein the vector x represents the mechanical quantity at points of the mesh. A linear solver of the preconditioned conjugate gradient-type generates the elements of the vector x from A and f using a preconditioning matrix K. The linear solver generates a principal submatrix from the stiffness matrix by setting to zero those elements therein and positioned such that the degree of freedom index associated with their row is not equal to the degree of freedom index associated with their column. The linear solver also generates the preconditioning matrix K from the principal submatrix. The mechanical quantity of the structure is visualized on the computer aided design system as a function of the vector x.

7 Claims, 2 Drawing Sheets

COMPUTER AIDED DESIGN SYSTEM

This invention relates to computer-aided design (CAD) systems.

Interactive computer-aided design (CAD) systems have become accepted universally as important engineering design tools for a variety of applications in mechanical, civil, and electrical engineering. In these areas CAD systems have boosted design productivity by enabling more rigorous engineering analysis, enhancing the accuracy and quality of design documentation, reducing errors and bridging the gap between design and manufacturing.

Significant advantages of CAD arise from the fact that, after information regarding the shape and physical properties of a product has been captured and stored in the system in the form of a geometric model, CAD systems generally permit the utilization of a wide variety of analysis, visualization, and manufacturing planning tools through appropriate data conversion and interfacing modules.

These days, in addition to the production of engineering drawings and other design information, CAD systems are also used directly to produce control signals and data for subsequent use in directing the operation of manufacturing equipment, such as robots or machine tools.

In industries where the analysis of stress is an important aspect of design, the integration of CAD and computational structural analysis is now a well established tool.

In structural analysis, designers are looking for approximate descriptions of how an unknown mechanical quantity, for example the displacements, strains and stresses which occur at various points of a structure, vary throughout a finite region within a component as, for instance, functions of given loadings or forces at prescribed points.

In the finite element method the behavior of a physical system whose parameters are stored in the system, is described in mathematical terms, via the application of known laws of physics, as a problem whose solution reveals a property of the system it is desired to elucidate.

The region is divided into elements, each of which are equivalent to simple elements such as beams, shells, or rods, over which the property is considered to vary in a known manner and to which classical mechanical principles can be applied. The application of such principles yields a system of algebraic equations.

There exists substantial published literature concerning both theoretical and practical aspects of the finite element method. A useful summary of the important practical aspects can be found in O. C. Zienkiewitcz 'The Finite Element Method' McGraw Hill Book Company (UK) Limited (1977).

The number of elements which make up a useful finite element model is generally very large indeed. Consequently, the algebraic equations and the number of unknowns are also usually very large. Present-day typical common orders of magnitude are $10^3$–$10^6$. The matrices involved are sparse, but usually not very sparse: hundreds of nonzero elements may occur in most rows, as is the case, for example, in full-3D serendipic FEM. The only way which these equations may be used to render information about the structure is via their numerical solution using brute computational force.

The computational cost associated with finite element analysis is dominated by the solution of these extremely large systems of algebraic equations and the cost and availability of sufficient computing power is the principal factor which currently limits the application and precision of finite element techniques. It is therefore of paramount technical importance to find ways of improving the computational efficiency with which numerical solutions to these equations can be generated.

The present invention is directed to solving the technical problem of improving the computational efficiency of finite element analysis which currently limits the scope of application and the precision of the method and substantially determines its cost.

The solver generally provided for a CAD system conventionally comprises two parts—an iteration mechanism, for handling non-linear and dynamic problems and a linear solver for solving both linear problems as well as the linear systems arising within each iteration in solving non-linear and dynamic problems.

It is the linear solver which accounts for most of computational work involved in finite element analysis.

By far, most commercial structural analysis packages in use today are using what are known as "direct solvers" as their linear solvers. While these are very robust, suit the needs of handling multi-point constraint,—and efficient in the treatment of "variable-loading" problems, they have large storage requirements and are usually slow, especially in the treatment of even medium size, ie of the order of several thousand degrees of freedom, 3-D problems. These drawbacks become acute when computational resources are limited.

An additional disadvantage of direct solvers is that they have no means for specifying the needed accuracy, and even when relatively low accuracy, say 3–4 decimal digits for typical engineering problems, is needed, direct-solvers are not capable of taking advantage of this situation.

Iterative techniques are the natural alternative to direct solvers. However prior art iterative solvers suffer from a strong dependance on Condition-Numbers—large condition numbers reduce the convergence rate drastically. The stiffness matrices generated through application of the finite element method are generally symmetric positive definite, but the spread of their spectrum may be very broad, resulting in large condition numbers and hence poor convergence when iterative techniques are applied. The spectrum of the matrix depends on the structure's geometry, its physical-properties and the prescribed boundary-conditions. In particular, certain material-properties, for example when the Poisson's coefficient approaches 0.5, may lead to highly ill-conditioned systems of equations.

Furthermore, it is difficult to tackle multi-point constraints and problems with several loadings using iterative techniques.

In order to overcome the convergence-rate difficulty, matrix preconditioners are used in order to reduce condition-numbers. However, in the case of structural analysis, existing preconditioners either do a rather-poor job, or are insufficiently robust for routine use. In addition, the presence of multi-point constraints is a difficulty for preconditioners applying some kind of an 'Incomplete L-U factorization', and problems with variable loadings are unsuitable for efficient, in the sense of avoiding the need to 'start from scratch', treatment.

Iterative methods of the conjugate gradients type, preconditioned by incomplete L-U factorization (ILU) are known in certain cases to be very competitive for solving sparse symmetric positive definite linear systems.

However, in structural analysis this method, known as the Preconditioned Conjugate Gradient (PCG) method, may frequently fail due to the resulting preconditioner not being positive definite. Furthermore, if, after multiplication by the preconditioner, the new coefficients matrix still has a large condition number the method will suffer from slow convergence.

As a result of theoretical investigation and a thorough numerical verification process, the inventors have found that by the use of particular preconditioning matrices, which are generated from the stiffness matrix, in the PCG method the computational efficiency with which the solutions of the FEM equations may be generated can be greatly improved.

Accordingly, this invention provides a computer-aided design system in which a mechanical quantity of a structure can be determined from stored geometrical representation of the structure, the material properties thereof and the loads imposed thereon, comprising: means to generate data describing a structure as a mesh; means to generate, by application of the finite element method to the mesh, the elements of a stiffness matrix, a loading vector, and a vector including an associated degree of freedom index for each row and column of the stiffness matrix, means to generate from the stiffness matrix and the loading vector elements of matrix A and a right hand-side vector f, where A and f are related through the relation Ax=f, the vector x representing a mechanical quantity at a plurality of points of the mesh; and a linear solver of the preconditioned conjugate gradient type for generating, for subsequent processing or display, the elements of the vector x from A and f using a preconditioning matrix, the system being characterised in that the linear solver comprises means to generate a principal submatrix from the stiffness matrix by setting to zero those elements therein in positions such that the degree of freedom index associated with their row is not equal to the degree of freedom index associated with their column and means to generate the preconditioning matrix from the principal submatrix.

The preconditioner derived by this new method requires less computing time than preconditioners of the incomplete factorization type and leads to a faster and more reliable Preconditioned conjugate gradient (PCG) procedure than the existing ones. A preconditioning submatrix is obtained which is sparser than the original stiffness. This preconditioning is cheaper and more robust with respect to material parameters than the well known ICCG methods. In many cases the preconditioning submatrix is M-matrix, its incomplete factorization is guaranteed to exist, and to be positive definite.

Preferably, the ILU procedure is applied to the principal submatrix of the full stiffness matrix, thereby assuring a positive definite preconditioner under mild conditions.

In many cases, various short-cuts or idealizations are introduced by the user, which are actually a partial deviation from the full-bodied theory of elasticity. Such is the case of the treatment of Shells via the Bi-Harmonic PDE, resulting from disregarding shear, while another example is the inclusion of certain substructures which are declared to be "rigid"—resulting in the addition of certain 'Multi-Point Constraints', which, in turn, yield a corresponding subsystem of algebraic equations, usually of a different nature as compared with the main one. In addition, Single-Point constraints are also very common, due to boundary-conditions, etc.

An embodiment of the invention will now be described, by way of example only, with reference to the drawings, wherein.

Figure 1:
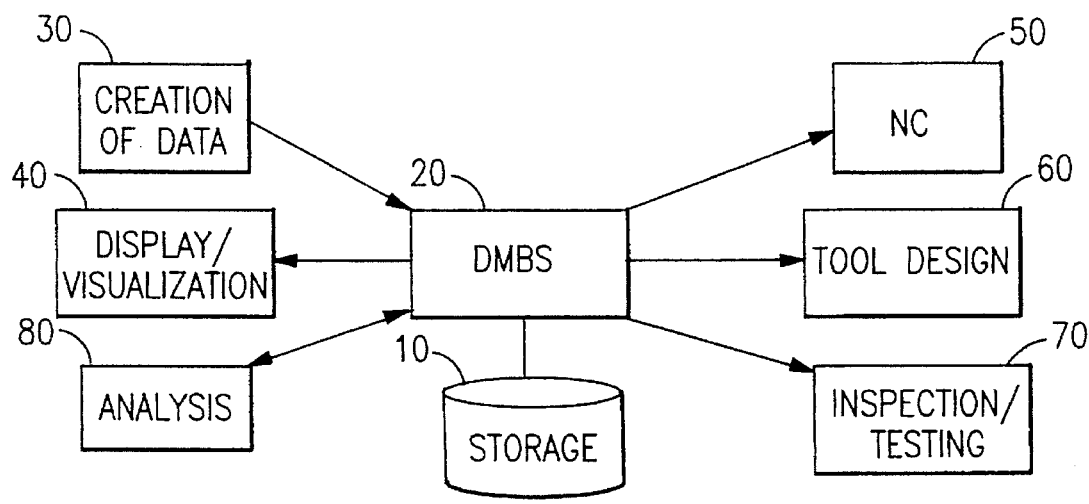
FIG. 1 is a schematic diagram showing a computer aided design system according to the invention.

FIG. 1 is a schematic diagram of a computer aided design system according to the invention. The geometry of a structure, finite element mesh information, elements information, material properties, Boundary-conditions and loading information are stored in storage device 10 under the control of Data Base Management System (DBMS) 20. This data is input via a front-end graphical interface 30. A display system 40, which includes a visual display unit and a printer, is used for displaying images of the structure and the stress & strain tensor, as well as the displacements (deformation), at prescribed portions of the structure using appropriate data visualization techniques. The display system also includes software for relevant report generation for display or printing.

The information stored in the database is used to control numerical control module 50 which generates numerical control code for controlling machine tools used in manufacturing the structure being designed. Tool design module 60 handles the design of the tools required to make the structure. Inspection and testing module 70 generates data for use in inspection and testing of the manufactured structure. The general operation of these modules is well understood in the art and will not be further described herein.

The CAD system also includes a finite element method (FEM) module 80 which enables a stored structure to be tested and various of its properties to be determined using finite element analysis.

Figure 2:
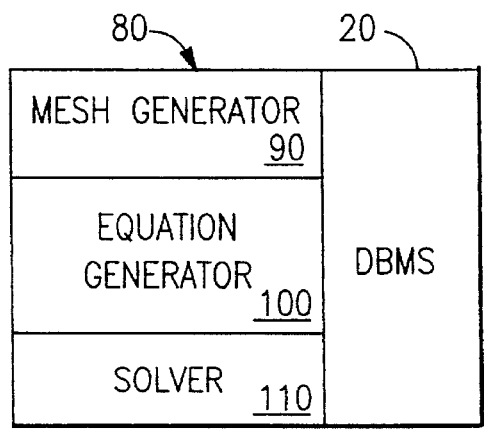
FIG. 2 is a schematic diagram showing the FEM analysis module.

FIG. 2 is a schematic diagram showing the Finite element analysis module 80 and the interface with DBMS 20. FE module 20 comprises a graphical mesh generator 90 to generate the division of the structure into elements, equation generator 100 for generating the system of algebraic equations which describe the behaviour of the structure, and solver 110 for solving the generated equations to calculate the desired property. Discretization of the problem by finite element method (FEM) leads to a linear system of equations, generated by the equation generator, Ax=f, where $A=(a_{ij})$ is a stiffness matrix, $f=(f_i)$—right hand side (r.h.s) vector and $x=(x_i)$—vector of unknowns $i,j=1,2,\ldots,n$.

In structural analysis, it is generally necessary to solve the following types of elastic problems, where the displacements of parts of the structure are unknown parameters:

a) Linear Equilibrium problems.
b) Non-Linear Equilibrium problems.
c) Dynamical problems which include forces of inertia.
d) Eigenvalue/eigenvector problems—Normal mode dynamics.

Various theories of elasticity can be used to formulate these problems, all of them resulting in a system of elliptic partial differential equations. For dynamical problems, the space derivative part is elliptic. Various types of finite elements can be used, including Serendipic and P-elements.

When the finite element method is applied to the relevant system of partial differential equations which corresponds to a linear equilibrium problem, one obtains, a system of linear algebraic equations, in which a stiffness matrix multiplies the vector of unknown displacements, while a certain right-hand side vector prescribes the loadings information.

In non-linear equilibrium problems as well as in various dynamical problems, the FEM discretization leads to a system of algebraic equations, and the application of various iterative techniques devised for their solution results, again, within each iteration, in a similar system of linear algebraic equations.

There exist a maximum of 6 degrees of freedom at each point of an elastic body $u_1, u_2, u_3$—translations; and $u_4, u_5, u_6$—rotations. Each entry $x_i$ of the solution vector x corresponds to a node j and a degree of freedom $m \in (1,2,\ldots,6)$. A vector L of degrees of freedom is generated which has, as i-th component, that value of m which corresponds to the component $x_i$.

Figure 3:
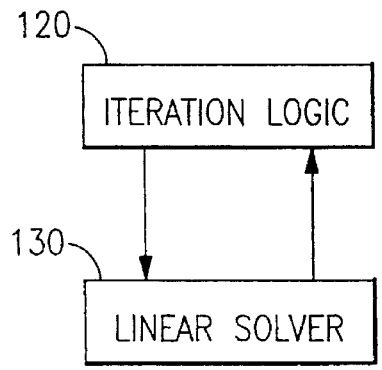
FIG. 3 is a schematic diagram showing the solver.

Solver module 110 is shown schematically in FIG. 3 and comprises two parts—an iteration mechanism 120, for handling non-linear and dynamic problems and a linear solver 130 for solving both linear equilibrium problems as well as the linear systems arising within each iteration in solving non-linear and dynamic problems.

Linear solver 130 is the critical element in the operation of the whole CAD system. It must be capable of handling Single & Multi-Point Constraints, be efficient and sufficiently accurate even when handling large condition numbers and maintain its efficiency in solving for cases with variable loadings, or arbitrarily specified multi-loading systems, by avoiding, as far as possible, the need to start from scratch whenever a new loading-system is being treated.

Figure 4:
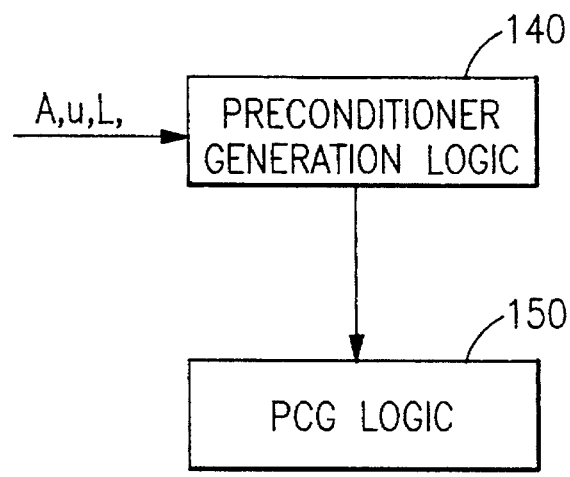
FIG. 4 is a schematic diagram showing the linear solver.

FIG. 4 is a schematic block diagram illustrating the linear solver. It takes as input the stiffness matrix and the right hand side vector generated by equation generator 100. From these a preconditioning matrix is generated and, using this preconditioning matrix, the preconditioned conjugate gradients method is applied using a suitable computer subroutine to solve the equations generated by the equation generator. The preconditioned conjugate gradients method was originated by R. Hestenes, E. Steifel. 'Methods of conjugate gradients for solving linear equations' Journal of Research of the National Bureau of Standards, 49,409–435, (1952). The present form of PCG is described in the book by Gene H Golub, Charles F Van Loan 'Matrix computations', John Hopkins University Press (1984).

In order to solve the equation Ax=f, the PCG method with the preconditioner K proceeds as follows. A trial solution $x_0$ is selected. Vectors $r_0$ and $P_0$ are defined as $r_0$f=-A$x_0$ and $P_0=K^{-1}r_0$.

The following steps are then performed iteratively until convergence is achieved.

$$\alpha_i = (K_{-1}r_{i-1}, r_{i-1})/(p_{i-1}, Ap_{i-1}) \quad (1)$$

$$x_i = x_{i-1} + \alpha_i p_{i-1} \quad (2)$$

$$r_i = r_{i-1} - \alpha_i A p_{i-1} \quad (3)$$

$$\beta_i = (K^{-1}r_i, r_i)/(K^{-1}r_{i-1}, r_{i-1}) \quad (4)$$

$$p_i = K^{-1}r_i + \beta_i p_{i-1} \quad (5)$$

where the expression in the form of (Vector_x, Vector_y) represents the scalar product of the vectors Vector_x and Vector_y.

A suitable efficient matrix-vector multiplication, which can be adapted for the particular computer being used, is used for the multiplication operations.

Figure 5:
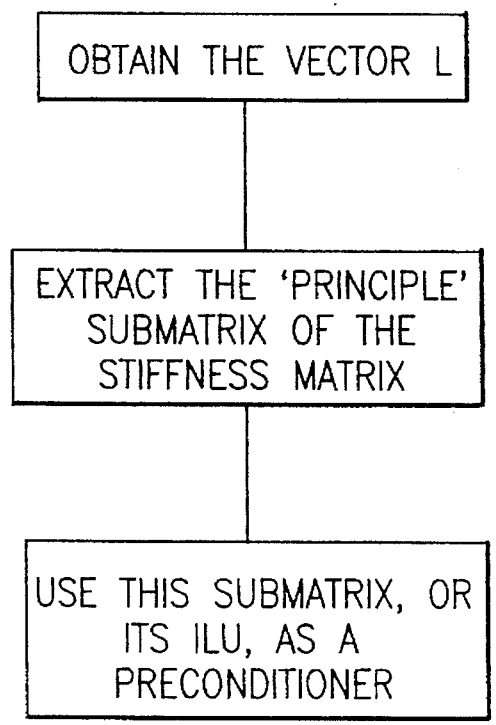
FIG. 5 is a flow chart showing the generation of the preconditioning matrix.

FIG. 5 shows the steps performed in the generation of the preconditioning matrix. A 'principal' submatrix $B=(b_{ij})$ is extracted from the stiffness matrix $A=(a_{ij})$ by setting to zero those elements in the stiffness matrix for which the degree of freedom index associated with their row is not equal to the degree of freedom index associated with their column, using a method described in the following pseudo-code:

```
do i = 1, n
  do j = 1, n
    if l_j = l_i then b_ij = a_ij
    else b_ij = 0
  enddo
enddo
```

Where $l_i$ are components of vector L. The resulting matrix is a matrix in which the coupling between certain degrees of freedom is eliminated.

Following both a theoretical and experimental verification, the inventors have found that using this process either the matrix B defined above or the matrix B' can be used as preconditioning matrices for the stiffness matrix, where B' is the result of applying the incomplete LU factorization to the matrix B.

The incomplete L-U factorization is obtained as follows. If it is desired to solve the matrix equation Ax=f, where A is a large sparse nxn matrix, choosing a Gaussian elimination would lead us to a factorization A=LU. However this method has the problem that the number of non-zero elements is much greater than the number of non-zero elements in the sparse matrix A, and since only the non-zero elements are stored this results in a high cost in terms of storage and complexity.

To avoid these difficulties an incomplete factorization technique is used to obtain a splitting A=LU - R, where the fill-in has been controlled by zeroing previously determined coefficients in L and U during the elimination. Such a technique is described in D. S. Kershaw 'The Incomplete Cholesky-Conjugate Gradient Method for the iterative Solution of Systems of Linear Equations.' Journal of Computational Physics 26, 43–65 (1978).

In the case of a boundary value problem for an elastic body with rigid inclusions, the problem is usually formulated as a boundary value problem for an elastic body with holes instead of rigid inclusions, but with multipoint constraints generated by the rigid inclusions. It is known that a rigid element has only 6 independent degrees of freedom in 3D problems (3 in 2D). For example it may consist of the degrees of freedom of a single node.

Other degrees of freedom for 3D rigid elements can be found by the kinematic relations, $$u_j = u_0 + r_{j0} \times \omega_0; \quad \omega_j = \omega_0,$$

where $u(u1,u2,u3)$ is the vector of displacements and $\omega(u4, u5,u6)$ is the vector of rotations, j is any node with dependent degrees of freedom and $r_{j0}$ is a pointer vector from point 0 to point j.

If the total number of degrees of freedom g consists of n independent degrees of freedom and m dependent degrees of freedom, then the relation between the dependent degrees of freedom and the independent ones can be written in matrix form as $u_m = G_{mn}u_n$, where $G_{mn}$ is an m×n rectangular matrix.

The saddle point formulation and finite element method are used for discretization of the problem, giving rise to the following algebraic equation, $$\begin{pmatrix} K_{gg} & G^t_{mg} \\ G_{mg} & 0 \end{pmatrix} \begin{pmatrix} U_g \\ \lambda_m \end{pmatrix} = \begin{pmatrix} P_g \\ 0 \end{pmatrix}, G_{mg} = (G_{mn}, -I_{mm})$$

where $K_{gg}$ denotes the FEM matrix for the elastic body with holes replacing the rigid inclusions. This will be referred to as the hole stiffness matrix'. $G_{mg}$ is the matrix of multipoint constraints, $P_g$ is the loading vector and $\lambda$ the vector of Lagrange multipliers. $I_{mm}$ is the m×m unit matrix.

In this case a principal submatrix $K^d_{gg}$ is extracted from the hole stiffness matrix $K_{gg}$ using the method described above. It has been found by the inventors that a reduced resolving matrix $$R_{nn} = G^t_{gn} K^d_{gg} G_{gn}$$

where, $$G_{gn} = \begin{pmatrix} I_{nn} \\ G_{mn} \end{pmatrix}$$

or the result of applying the incomplete factorization to $R_{nn}$ as above can be used as a preconditioner for the resolving matrix $K_{nn}$ in the equation, $$K_{nn}U_n = G^t_{gn}P_g, \ K_{nn} = G^t_{gn}K_{gg}G_{gn}, \ U_g = G_{gn}U_n$$

This equation can then be solved in the same way using the preconditioned conjugate gradients method.

In practice, many applications of structural analysis require a system of algebraic equations to be solved for several loading vectors right-hand sides. For example, this situation arises in linear problems with several loadings, in the inverse power method for normal mode dynamics and in iterative methods for non-linear problems.

One way of achieving this is by treating each system separately, for each i, i=1 . . . k, via PCG, using the above preconditioner. However, this would be expensive in terms of computer time.

These situations are handled in this embodiment of the invention in the following manner, which is both efficient & numerically reliable.

If the system to be solved is $Ax_k=f_k$, for k=1, 2, 3 . . . N, the linear problem for the first right hand side vector $f_1$ is solved using the method described above. The sequence of coordinate vectors to the base sequence $W=P(1)=\{p^1_1, p^1_2, \ldots, p^1_{m1}\}$ obtained during the PCG procedure described above are stored. For the subsequent right hand side vectors $f_k$ the solutions $x_k$ are found in two steps. In the first step the A—orthogonal projection $y_k$ of $x_k$ on the space generated by the basic sequence W, i.e. the span W, as well as the corresponding residual $r_k$ are calculated. In the second step, the linear problem $Az_k=r_k$ is solved using the PCGM algorithm described below. The sequence of coordinate vectors $P(k)=\{p_1^k, p_2^k, \ldots, p_{mk}^k\}$ is now added to the basic sequence W to obtain an updated extended basic sequence. The approximate solution for $x_k$ is given by $x_k=y_k+z_k$.

A straightforward calculation of the A-orthogonal projection $Y_k$ of $x_k$ on the current span W, i.e.

$$y_k = \sum_1^m (Ax_k, u_j)u_j = \sum_1^m (f_k, u_j)u_j, \text{ where } u_j \in W$$

suffers from loss of precision, since small inner products of relatively large vectors are hard to resolve accurately. Thus in the preferred embodiment a cycling scheme is used for computing the projection y of x on W, as follows.

A parameter s is chosen between 1 and m. A quantity q is defined as q=[m/s]. Variables y, $\hat{y}$ and $\tilde{y}$ are initialized to zero. $r_0$ is set to $f_k$. For i=1, 2, . . . , q, the following steps are performed.

$$j_1 = 1 + (i-1)s, \quad j_2 = is \quad (1)$$

$$\left( \hat{y}_i = \sum_{j_1}^{j_2} (r_i, u_j)u_j \right) \quad (2)$$

$$r_i = r_{i-1} - \tilde{y}_{i-1} \quad (3)$$

$$\tilde{y}_i = \sum_{j_1}^{j_2} (r_i, u_j)Au_j \quad (4)$$

$$y_i = y_{i-1} + \hat{y}_i \quad (5)$$

Then set $y=y_q$ and $r=r_q$.

If the parameter s is increased, the accuracy improves but more calculations are required. A typical good order of magnitude for s is 10.

The purpose of PCGM is to obtain—in an efficient & reliable way—the solutions x(1), . . . ,x(k) to the systems of equations Ax(i)=f(i), (i=1 . . . k), corresponding to the loading-vectors f(1) , . . . ,f(k).

The PCGM consists of k subsequent STAGES, each depending on the results of the previous stages.

Each stage (i) produces the following:

1) A set of vectors p(i), which is added to a previously-constructed set W(i−1), so as to form the new set of vectors W(i). The way by which the vectors in p(i) is constructed is provided below, but it is important to emphasize that as a result of this construction, ALL the vectors in W(i) come out to be MUTUALLY A-ORTHOGONAL; By this is meant that if u,v are any two vectors in W(i), then u'Av=0, where here ' stands for the "transpose" operation for vectors.

2) An approximate solution x(i) to the system Ax(i)=f(i). The details of this construction are as follows: The set of vectors W(1) and x(1) are constructed via PCG (preconditioned-conjugate gradients) applied to the matrix A and f(1), and using the above-described preconditioner.

Having completed the i-th stage, the i+1 stage starts by construction of a vector y(i+1)—which is the A-projection of x(i+1) on SPAN W(i)—and this is done via the "PROJECTION" cyclic method, as described above.

Then, a corresponding "residual" r(i+1) is formed:

$$r(i+1) = f(i+1) - Ay(i+1)$$

The various vectors in P(i+1) are now constructed in the same way this is done as in ordinary PCG, using the above described preconditioner,—with the following exception:

Let y(1), . . . , v(i) each denote the LAST vector in, . . . p(i), respectively. Then, once a vector Q is constructed as one of the 'conjugate-directions' obtained during the PCG process—it is REPLACED by the vector $$Q = Q' - \sum_{j=1}^{i} \frac{(Q'Av(j)) \cdot v(j)}{(v(j), Av(j))}$$

(In order to orthogonalyze Q' on W(i))

This new vector Q is now added to p(i+1), all the vectors of which are stored. It is THIS operation which assures the mutual A-orthogonality of all the vectors in W(i+1).

The construction of an approximate solution x(i+1) then follows the procedure used in PCG. All the vectors in p(i+1) are now added to W(i), so as to form W(i+1), which is stored.

The difference from the repeated, 'from scratch' approach is that the "conjugate directions" constructed at each stage serve also in obtaining the solutions for the next loading/ stage. Furthermore, within each stage, the formation of "A PROJECTIONS" and "CONJUGATE DIRECTIONS" are modified considerably, but these are necessary in order to obtain numerical stability and efficiency in computational speed.

The PCGM algorithm ensures that the basic sequence W is orthogonalised by imposing that in the conjugate gradients procedure all the vectors of $P(i)=\{p^i_1, p^i_2 \ldots p^i_{mi}\}$ are orthogonal only to the last vectors of P(k), k=1, 2, . . . , i−1. The procedure is as follows.

$x^0$ is set to y, $r^0$ is set to R and $p^0$ is set to $k^{-1}$, where K is the preconditioning matrix. An index j is initialized to 1.

For k=i the following steps are performed.

(1) $p^{j-1}$ is set as Q above (2) A value $a^j$ is set to $(K^{-1}r^{j-1}, r^{j-1})/(p^{j-1}, Ap^{j-1})$, and $x^j$ is set to $x^j+\alpha^j p^{j-1}$ and $r^j$ to $r^{j-1} - \alpha^j Ap^{j-1}$ (3) A value $\beta^j$ is set to $(K^{-1}r^j, r^j)/(K^{-1}r^{j-1}, r^{j-1})$ and $p^j$ is set to $Kr^j+\beta^j p^{j-1}$ and then to $$j/\sqrt{(Ap^j, p^j)}.$$

(4) If a stopping criterion is satisfied, then $m_k$ is set to j, and P(k) is set to $\{p^1, p^2, \ldots, ^{nk}\}$, and, $$W = U \; P(k)$$

otherwise j is set to J+1 and the process repeated.

The invention can be implemented as a set of tools for a general purpose digital computer to serve in structural-analysis packages, which yield fast & robust iterative solutions, especially for medium and large 3-D problems and enable the Multi-Point Constraints and the several loadings cases to be handled efficiently when the number of Loading-Systems being solved does not exceed certain limits, which, with present-day machines seem to be around several tenths. These tools enable performance advantage to be taken of low-accuracy specs, and their storage requirements are very modest.

The inner structure of most structural analysis packages makes them ideal candidates for incorporating a solver which operates according to the invention. The packages are large, and are constructed from several modules that communicate information through a common interface. More so, because typical problems take considerable machine resources, most packages would have restart facilities, and additional tools for enhanced end-user input.

Even though the Solver module is only one among the several modules that makes the structural analysis package, it is the limiting one in terms of computer resources like memory, disk space and machine time. Incorporating a solver in accordance with this invention into the package will enable the user to execute larger problems using considerably less resources then those required by Direct Solvers.

What is claimed is:

1. A computer-aided design system for converting a stored geometrical representation of a structure, the material properties thereof and the loads imposed thereon into a visualization of a mechanical quantity of the structure, said system comprising:

means to generate a mesh from said stored geometrical representation of the structure, the material properties thereof and the loads imposed thereon, said mesh describing the structure;

means to generate, by application of the finite element method to the mesh, the elements of a stiffness matrix, a loading vector, and a vector including an associated degree of freedom index for each row and column of the stiffness matrix;

means to generate from the stiffness matrix and the loading vector a matrix A and a right hand-side vector f, wherein any restrained degrees of freedom have been eliminated from the stiffness matrix, and where A and f are related through the relation Ax=f, the vector x representing the mechanical quantity at a plurality of points of the mesh;

a linear solver of the preconditioned conjugate gradient type for generating the elements of the vector x from A and f using a preconditioning matrix K, wherein the linear solver comprises means to generate a principal submatrix from the stiffness matrix by setting to zero those elements therein in positions such that the degree of freedom index associated with their row is not equal to the degree of freedom index associated with their column and means to generate the preconditioning matrix K from the principal submatrix; and means for visualizing the mechanical quantity of the structure on the computer-aided design system as a function of said vector x.

2. System as claimed in claim 1 wherein the generation of the preconditioning matrix comprises applying an incomplete factorisation to the principal submatrix.

3. System as claimed in claim 1 wherein the stiffness matrix is the matrix A and the right hand side vector f is the loading vector.

4. System as claimed in claim 2 wherein the stiffness matrix is the matrix A and the right hand side vector f is the loading vector.

5. System as claimed in claim 1 wherein the stiffness matrix and the matrix A are related by the equation:

$$A = G'_{gn} K_{gg} G_{gn}$$

where $K_{gg}$ is the stiffness matrix and $G_{gm}$ is a matrix relating independent degrees of freedom in the structure to dependent degrees of freedom in the structure; the right hand side vector f and the loading vector are related by the equation:

$$f = G'_{gn} P_g$$

where $P_g$ is the loading vector, and the preconditioning matrix K is generated from the matrix $K^d_{gg}$ through the relation $R_{nn} = G'_{gn} K^d_{gg} G_{gn}$ where $K^d_{gg}$ is the principal submatrix associated with $K_{gg}$.

6. System as claimed in claim 5 wherein the generation of the preconditioning matrix comprises applying an incomplete factorisation to the matrix $R_{nn}$.

7. A computer aided design system for converting a stored geometrical representation of a structure, the material properties thereof and the loads imposed thereon into a visualization of a mechanical quantity comprising at least one of stresses, strains and displacements of the structure, said system comprising:

a storage device containing said stored geometrical representation of the structure, the material properties thereof and the loads imposed thereon;

a data base management system for accessing said storage device;

means to generate a mesh from said stored geometrical representation of the structure, the material properties thereof and the loads imposed thereon by accessing said data base management system, said mesh describing said structure;

means to generate, by application of the finite element method to the mesh, the elements of a stiffness matrix, a loading vector, and a vector including an associated degree of freedom index for each row and column of the stiffness matrix;

means to generate from the stiffness matrix and the loading vector a matrix A and a right hand-side vector f, wherein any restrained degrees of freedom have been eliminated from the stiffness matrix, and where A and f are related through the relation Ax=f, the vector x representing the mechanical quantity at a plurality of points of the mesh;

a linear solver of the preconditioned conjugate gradient type for generating the elements of the vector x from A and f using a preconditioning matrix K, wherein the linear solver comprises means to generate a principal submatrix from the stiffness matrix by setting to zero those elements therein in positions such that the degree of freedom index associated with their row is not equal to the degree of freedom index associated with their column and means to generate the preconditioning matrix K from the principal submatrix; and means for visualizing the mechanical quantity comprising the at least one of stresses, strains and displacements of the structure on the computer-aided design system as a function of said vector x.

* * * * *

UNITED STATES PATENT AND TRADEMARK OFFICE
CERTIFICATE OF CORRECTION

PATENT NO. : 5,557,710
DATED : Sep. 17, 1996
INVENTOR(S) : Vardy Amdursky et al.

It is certified that error appears in the above-identified patent and that said Letters Patent are hereby corrected as shown below:

| | | |
|---|---|---|
| Col. 7, line 5 | | After "vectors" insert --/--. |
| Col. 8, line 24 | | "y(1)" should be --v(1)--. |
| | line 24-25 | "...p(i)," should be --P(1),...P(i)--. |
| | line 52 | "$k^{-1}$" should be --$K^{-1}r^0$--. |
| | line 62 | "$n^k$" should be --$p^{mk}$--. |
| | line 67 | "J+1" should be --j+1--. |
| Col 10, line 9 | | "$G_{gm}$" should be --$G_{gn}$--. |

Signed and Sealed this

Third Day of December, 1996

Attest:

BRUCE LEHMAN

Attesting Officer

Commissioner of Patents and Trademarks